United States Patent
Payne

(10) Patent No.: US 8,305,113 B1
(45) Date of Patent: Nov. 6, 2012

(54) INTRA-PAIR SKEW CANCELLATION TECHNIQUE FOR DIFFERENTIAL SIGNALING

(75) Inventor: Robert F. Payne, Lucas, TX (US)

(73) Assignee: Texas Instruments Incorporated, Dallas, TX (US)

( * ) Notice: Subject to any disclaimer, the term of this patent is extended or adjusted under 35 U.S.C. 154(b) by 8 days.

(21) Appl. No.: 13/100,965

(22) Filed: May 4, 2011

(51) Int. Cl.
*H03K 5/153* (2006.01)
(52) U.S. Cl. .......................................... 327/72
(58) Field of Classification Search .................. None
See application file for complete search history.

(56) References Cited

U.S. PATENT DOCUMENTS

| | | |
|---|---|---|
| 6,335,647 B1 | 1/2002 | Nagano |
| 6,909,980 B2 | 6/2005 | Fernando |
| 7,729,874 B2 | 6/2010 | Keady et al. |
| 2005/0099216 A1 | 5/2005 | Dyer et al. |
| 2006/0244505 A1 | 11/2006 | Fung et al. |
| 2009/0174448 A1 | 7/2009 | Zabinski |

OTHER PUBLICATIONS

"A 5Gb/s Automatic Sub-Bit Between-Pair Skew Compensator for Parallel Data Communications in 0.13μm CMOS, "IEEE Symposium on VLSI Circuits/Technical Digest of Technical Papers, Jun. 16-18, 2010, pp. 71-72 (Yuxiang Zheng, Jin Liu, Robert Payne, Mark Morgan, and Hoi Lee).
"Unbalanced Twisted Pairs Can Give You the Jitters!" Maxim Engineering Journal, vol. 64, Sep. 2008, pp. 5-12 (Robert Olisar).
U.S. Appl. No. 12/948,757, filed Nov. 18, 2010.

*Primary Examiner* — Lincoln Donovan
*Assistant Examiner* — Sibin Chen
(74) *Attorney, Agent, or Firm* — John J. Patti; Wade J. Brady, III; Frederick J. Telecky, Jr.

(57) ABSTRACT

A method for deskewing a differential signal is provided. A common-mode voltage of a differential signal and an average for the common-mode voltage of the differential signal are measured. A difference between first and second portions of the differential signal is determined, and deskew information is derived from the common-mode voltage and the average. The deskew information can then be combined with the difference to deskew the differential signal.

17 Claims, 7 Drawing Sheets

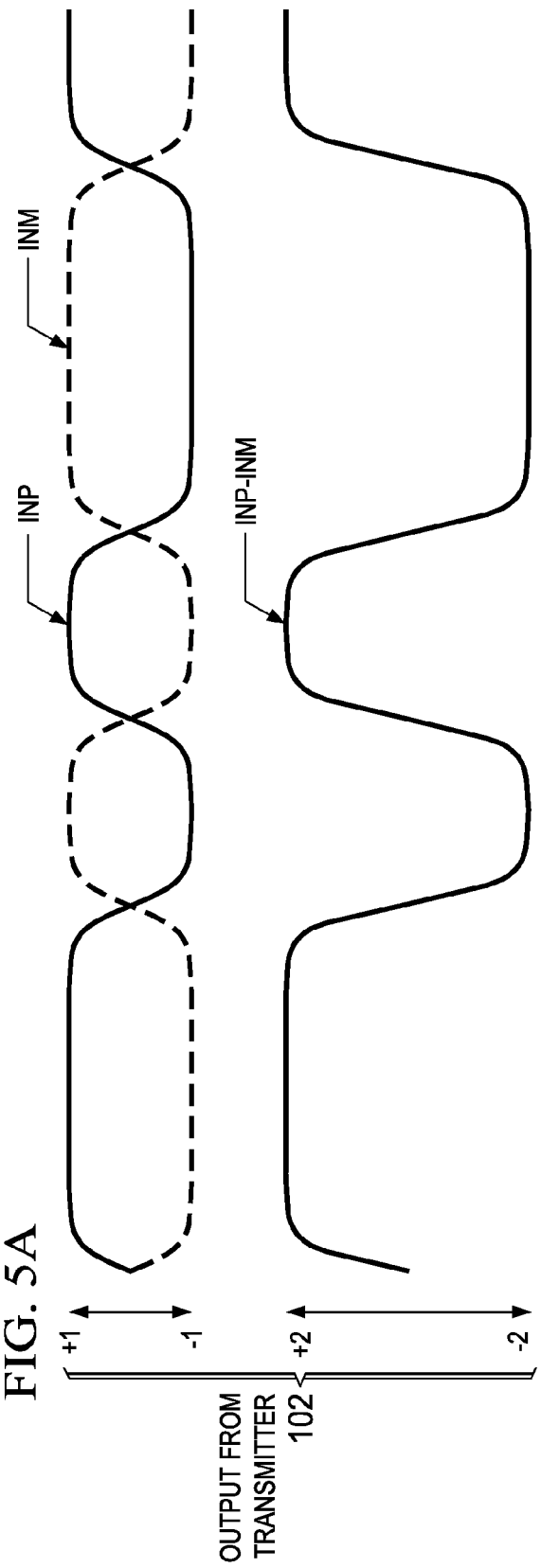

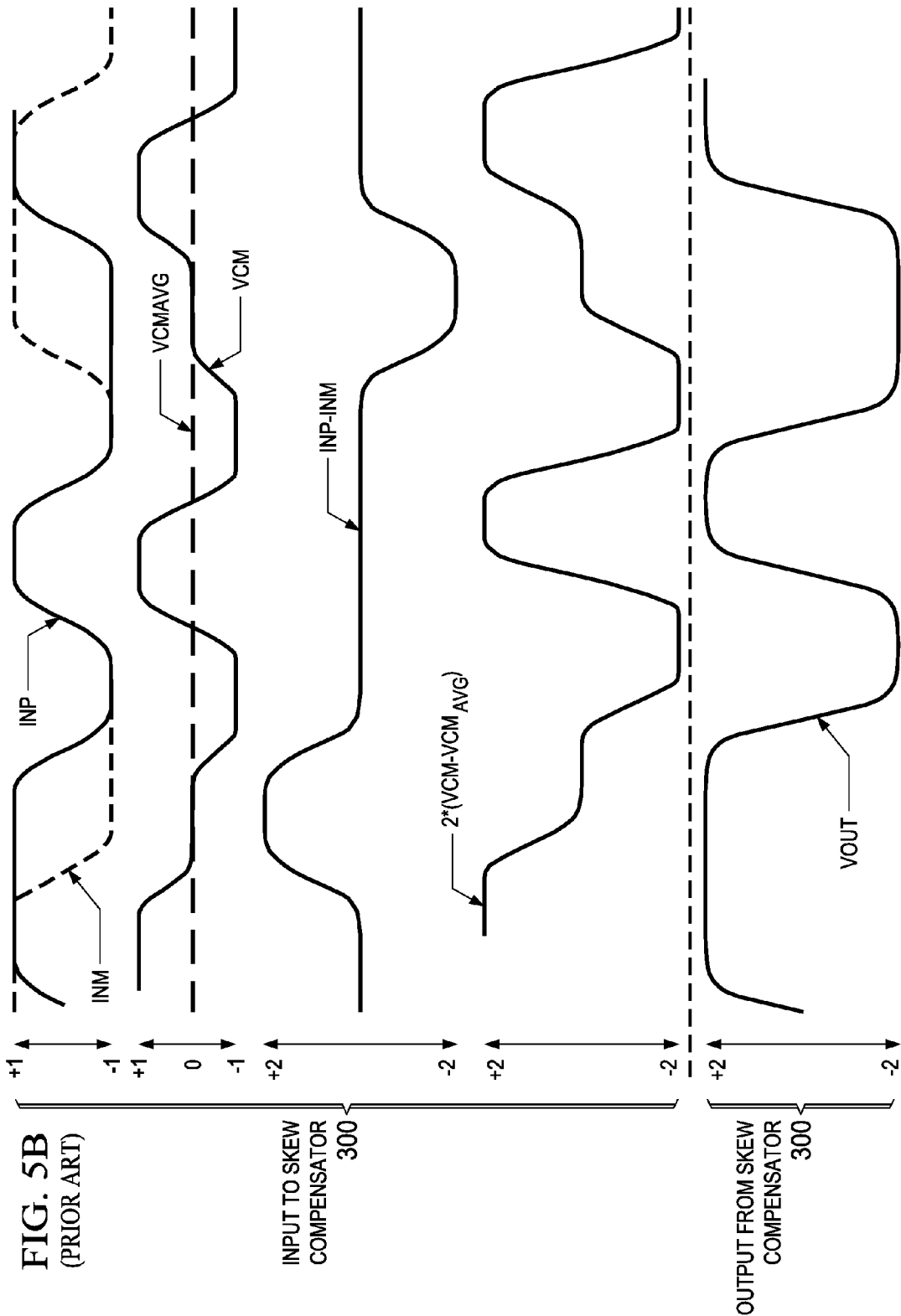

FIG. 6
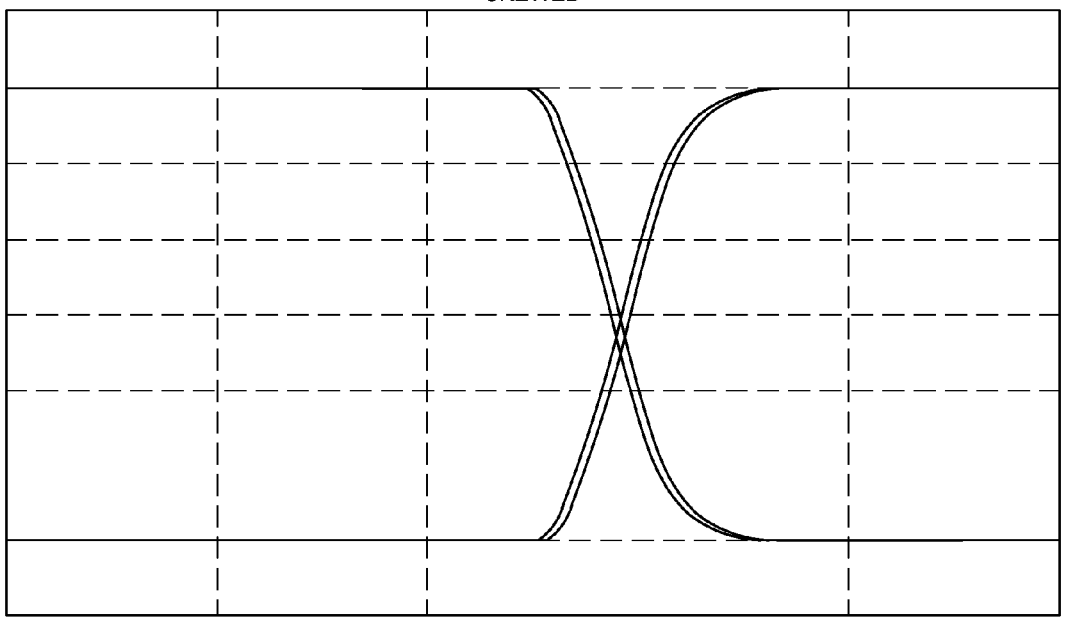
SKEWED
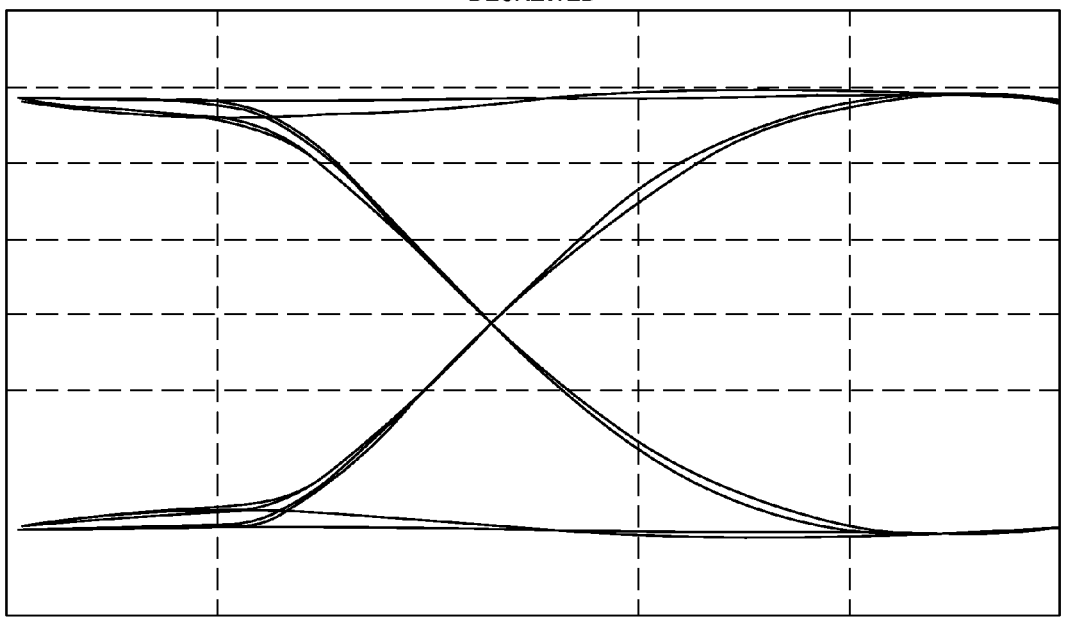
DESKEWED

FIG. 7
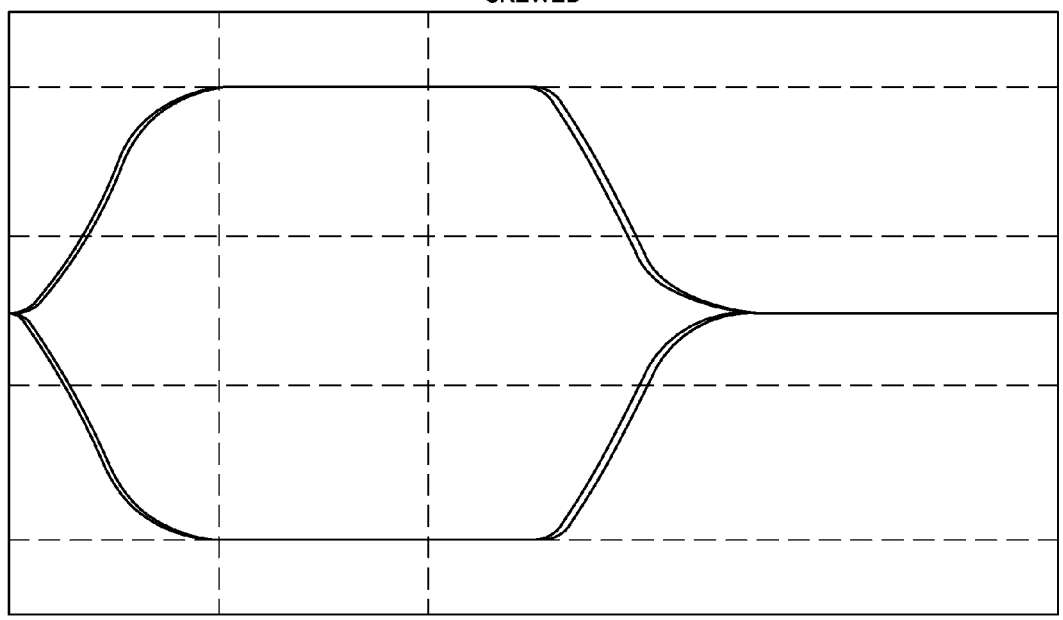
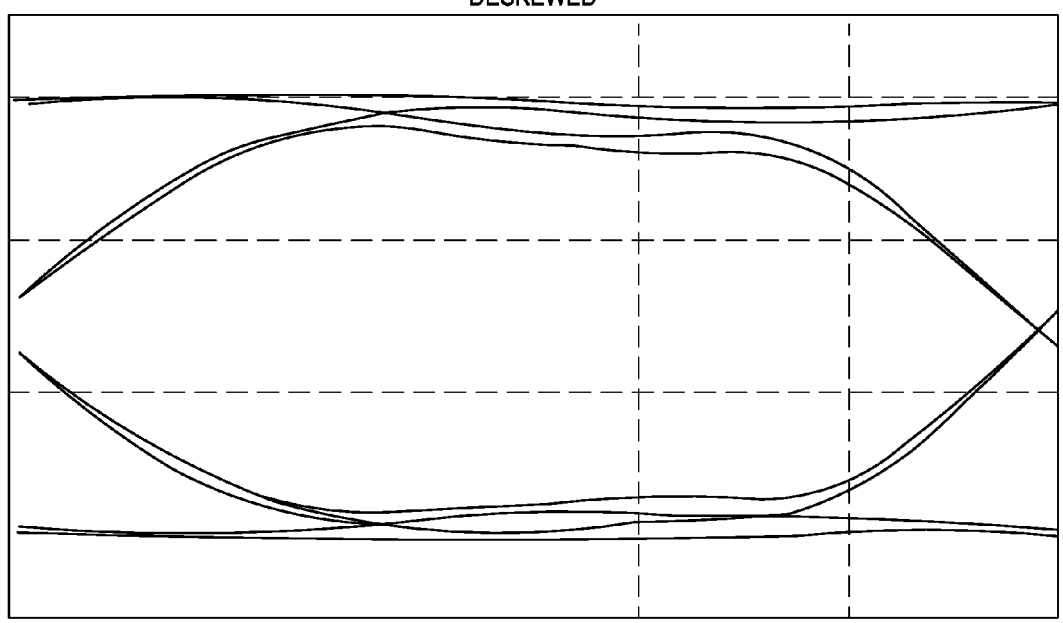

FIG. 8
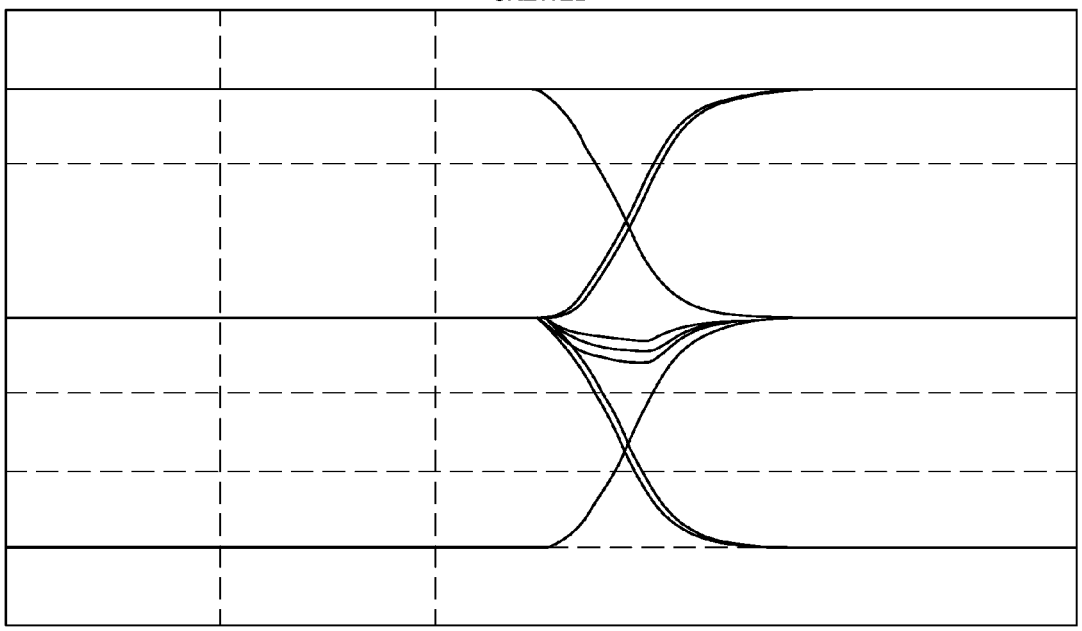
SKEWED
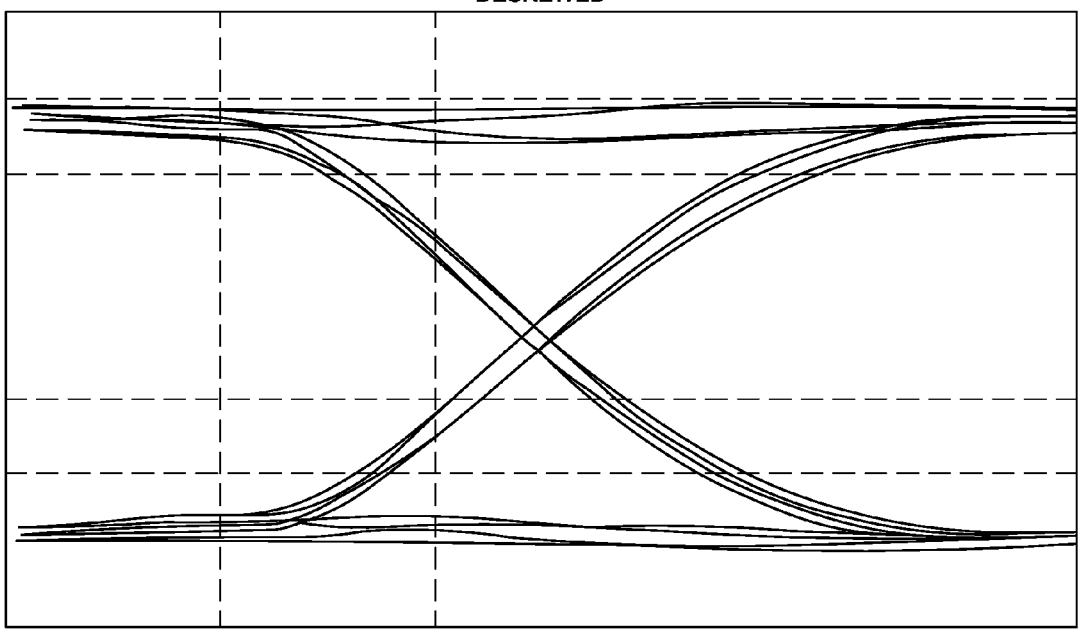
DESKEWED

INTRA-PAIR SKEW CANCELLATION TECHNIQUE FOR DIFFERENTIAL SIGNALING

TECHNICAL FIELD

The invention relates generally to deskewing circuitry and, more particularly, to intra-pair deskewing circuitry.

BACKGROUND

Turning to FIG. 1, an example of a conventional communication system 100 can be seen. This system 100 generally comprises a transmitter 102, a transmission medium 104, and a receiver 106. Typically, the transmission medium 104 is comprised of a pair of transmission lines that are configured to carry a differential signal from the transmitter 102 to the receiver 106. This type of system 100 is used in a wide variety of applications ranging from transmitting information over long distance (through cables) to on-chip communications. One issue with system 100 is that there is usually a length mismatch between the transmission lines in medium 104 that can lead to skew between the portions of the differential signal carried by the medium 104 (known as "intra-pair skew"), and an example of intra-pair skew can be seen in FIG. 2, where the transmission medium 104 for this example introduces 1 unit interval (UI) of skew. For low frequency signals, intra-pair skew can be largely ignored, but, for high frequency signals (i.e. >1 Gb/s), intra-pair skew can significantly impair communications.

To address intra-pair skew, several solutions have been proposed. These proposed solutions approach intra-pair skew as being a propagation delay issue, and an example of such a proposed solution can be seen in FIG. 3. As shown, skew compensator 200 (which is included within receiver 106) uses several delay elements 202-1 to 202-N coupled in series with one another to delay each portion of the differential signal accordingly to compensate for the intra- pair skew. Adjustments to the delay elements 202-1 to 202-N are made through adjustment of the control voltage VCNTL, but it can often be difficult to adequately adjust the relative delays to compensate for the intra-pair skew. Therefore, there is a need for an improved skew compensator.

Some other conventional circuits are: U.S. patent application Ser. No. 12/948,757; U.S. Pat. No. 6,335,647; U.S. Pat No. 6,909,980; U.S. Pat. No. 7,729,874; U.S. Patent Pre-Grant Publ. No. 2005/0099216; U.S. Patent Pre-Grant Publ. No. 2006/0244505; U.S. Patent Pre-Grant Publ. No. 2009/0174448.pdf; Zheng et al., "A 5 Gb/s Automatic Sub-Bit Between-Pair Skew Compensator for Parallel Data Communications in 0.13 µm CMOS," 2010 *Symposium on VLSI Circuits/Technical Digest of Technical Papers*, Jun. 16-18, 2010; Olisar, Robert, "Unbalanced Twisted Pairs Can Give You the Jitters!," *Maxim Engineering Journal*, Vol. 64, Sept. 2008, pp. 5-12.

SUMMARY

An embodiment of the present invention, accordingly, provides an apparatus. The apparatus comprises a measuring circuit that is configured to receive a differential signal and that is configured to determine a common-mode voltage; an averaging circuit that is configured to receive the differential signal and that is configured to determine an average for the common- mode voltage; and an output circuit having that is coupled to the measuring circuit and the averaging circuit and that is configured to receive the differential signal, wherein the output circuit determines a difference between first and second portions of the differential signal, and wherein the output circuit determines deskew information from the common-mode voltage and the average, and wherein the output circuit generates a deskewed differential signal from the deskew information and the difference.

In accordance with an embodiment of the present invention, the output circuit further comprises: a first differential amplifier that is configured to receive the differential signal; a second differential amplifier that is coupled to the measuring circuit and the averaging circuit; and an adder that is coupled to the first and second differential amplifiers.

In accordance with an embodiment of the present invention, the first and second amplifiers have first and second gains, respectively, wherein the second gain is twice the first gain.

In accordance with an embodiment of the present invention, the measuring circuit further comprises a voltage divider.

In accordance with an embodiment of the present invention, the averaging circuit further comprises: a first resistor that is configured to receive the first portion of the differential signal and that is coupled to the output circuit; a second resistor that is coupled to the first resistor and that is configured to receive the second portion of the differential signal; and a capacitor that is coupled to the first and second resistors.

In accordance with an embodiment of the present invention, a method is provided. The method comprises measuring a common-mode voltage of a differential signal; measuring an average for the common-mode voltage of the differential signal; determining a difference between first and second portions of the differential signal; determining deskew information from the common-mode voltage and the average; and combining the deskew information with the difference to deskew the differential signal.

In accordance with an embodiment of the present invention, the step of determining the deskew information further comprises determining a difference between the common-node voltage and the average.

In accordance with an embodiment of the present invention, the step of determining the difference between the first and second portions of the differential signal further comprises applying a gain to the difference between the first and second portions of the differential signal.

In accordance with an embodiment of the present invention, the gain further comprises a first gain, and wherein the step of determining the deskew information further comprises applying a second gain to the difference between the common-node voltage and the average.

In accordance with an embodiment of the present invention, the second gain is at least twice the first gain.

In accordance with an embodiment of the present invention, an apparatus is provided. The apparatus comprises a first terminal that is configured to receive a first portion of a differential signal; a second terminal is configured to receive a second portion of the differential signal; a measuring circuit that is coupled to the first and second terminals and that is configured to determine a common-mode voltage; an averaging circuit that is coupled to the first and second terminals and that is configured to determine an average for the common-mode voltage; a first difference circuit that is coupled to the first and second terminals and that is configured to determine a difference between the first and second portions of the differential signal; a second difference circuit that is coupled to the measuring circuit and the averaging circuit and that is configured to determine deskew information from the common-mode voltage and the average; and a combiner that is coupled to the first and second output circuits.

In accordance with an embodiment of the present invention, the first difference circuit further comprises a differential amplifier having a gain.

In accordance with an embodiment of the present invention, the differential amplifier further comprises a first differential amplifier, and wherein the gain further comprises a first gain, and wherein the second difference circuit further comprises a second differential amplifier having a second gain.

In accordance with an embodiment of the present invention, the combiner further comprises a node.

In accordance with an embodiment of the present invention, the second gain is at least twice the first gain.

In accordance with an embodiment of the present invention, the measuring circuit further comprises: a first resistor that is coupled to the first terminal and the second differential amplifier; and a second resistor that is coupled between the second terminal and the first resistor.

In accordance with an embodiment of the present invention, the averaging circuit further comprises: a node that is coupled to second differential amplifier; a third resistor that is coupled between the first terminal and the node; a fourth resistor that is coupled between the second terminal and the node; and a capacitor that is coupled to the node.

The foregoing has outlined rather broadly the features and technical advantages of the present invention in order that the detailed description of the invention that follows may be better understood. Additional features and advantages of the invention will be described hereinafter which form the subject of the claims of the invention. It should be appreciated by those skilled in the art that the conception and the specific embodiment disclosed may be readily utilized as a basis for modifying or designing other structures for carrying out the same purposes of the present invention. It should also be realized by those skilled in the art that such equivalent constructions do not depart from the spirit and scope of the invention as set forth in the appended claims.

BRIEF DESCRIPTION OF THE DRAWINGS

For a more complete understanding of the present invention, and the advantages thereof, reference is now made to the following descriptions taken in conjunction with the accompanying drawings, in which:

FIGS. 5A-8 are diagrams depicting the operation of the skew compensator of FIG. 4.

DETAILED DESCRIPTION

Figure 1:
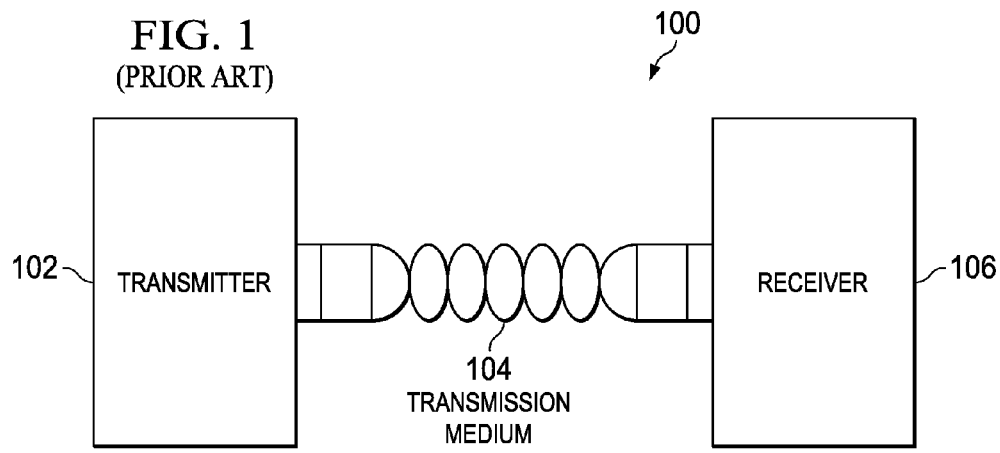
FIG. 1 is a diagram of an example of a conventional communication system.
Figure 3:
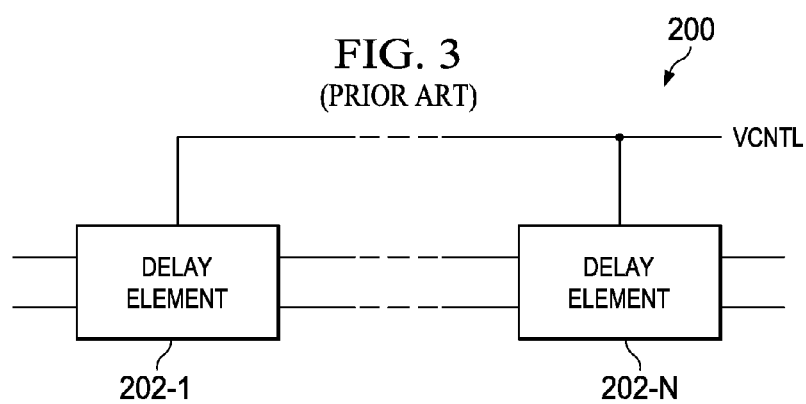
FIG. 3 is a diagram of an example of a conventional skew compensator.

Refer now to the drawings wherein depicted elements are, for the sake of clarity, not necessarily shown to scale and wherein like or similar elements are designated by the same reference numeral through the several views.

Figure 4:
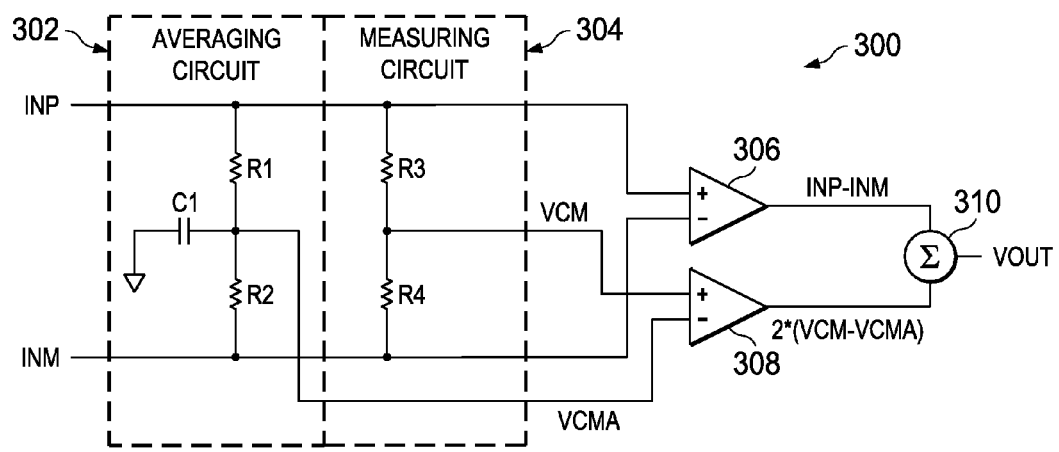
FIG. 4 is a diagram of an example of a skew compensator in accordance with an embodiment of the present invention.
Figure 2:
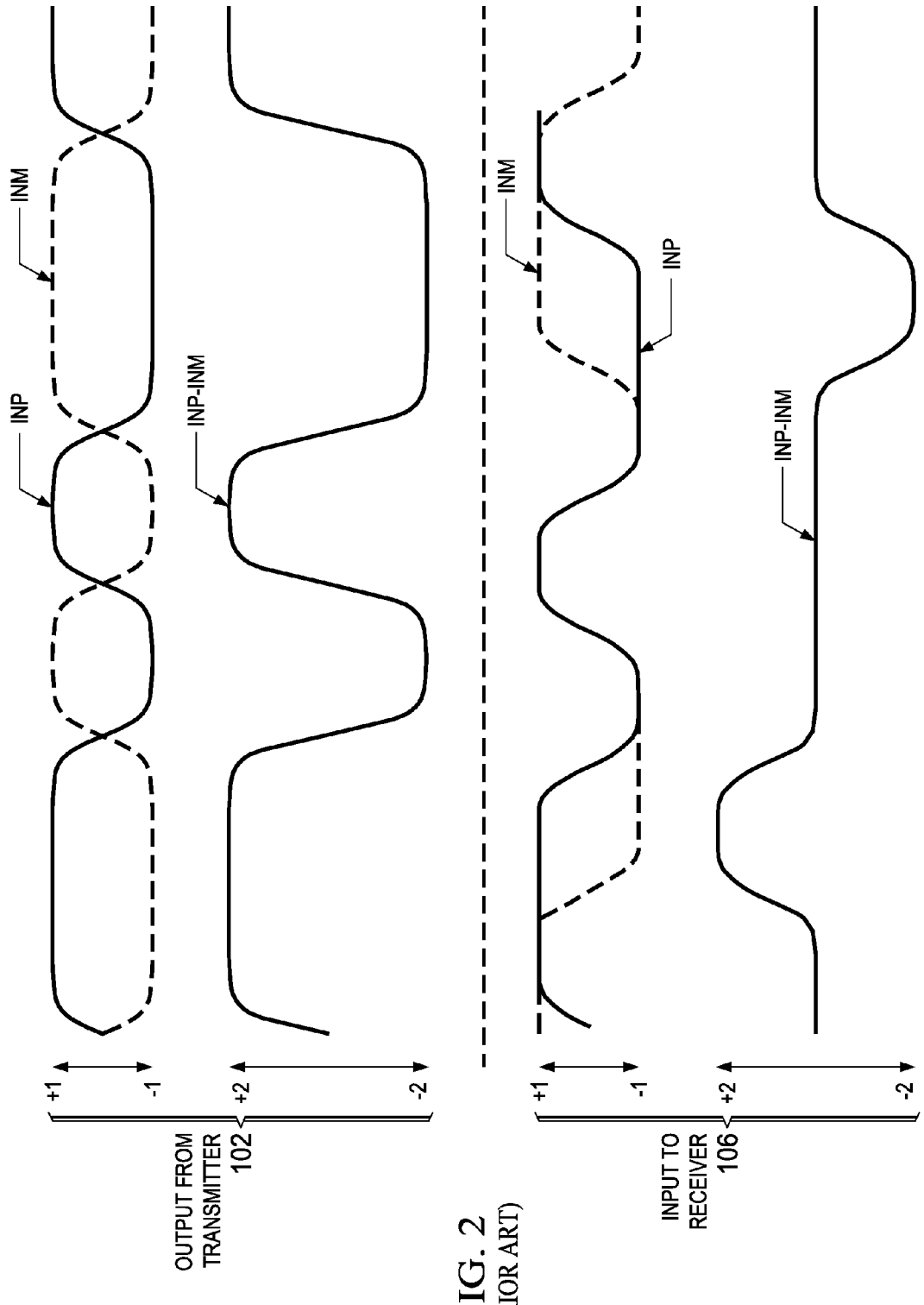
FIG. 2 is a diagram illustrating intra-pair skew for the system of FIG. 1.

Turning to FIG. 4, an example of a skew compensator 300 in accordance with an embodiment of the present invention can be seen. This skew compensator 300 is generally included in a receiver (i.e., receiver 106) so as to perform intra-pair skew compensation, and it generally comprises an averaging circuit 302, a measuring circuit 304, and an output circuit. The output circuit generally uses two difference circuits (which are typically differential amplifiers 306 and 308) that generate differential signal information and deskew information on a main signal path and a deskew path, respectively. This differential signal information and deskew information can then be combined by combiner 310 to generate an output signal VOUT that should generally match the desired, deskewed differential signal. Typically, differential amplifier 306 (which is in the main signal path) is coupled to the input terminals of the skew compensator 300 (which carry the portions INM and INP of the differential signal), while the differential amplifier 308 (which is in the deskew path) is coupled to the averaging circuit 302 and measuring circuit 304 so as to receive a common-mode voltage VCM and an average of the common-mode voltage VCMA. The common-mode voltage VCM is usually generated by the measuring circuit 304 through the use of a voltage divider (i.e., resistors R3 and R4), while the average VCMA is generated by using a voltage divider (i.e., resistors R1 and R2) to continuously measure the common-mode voltage VCM and a memory device (i.e., capacitor C1) to average it over a long period of time.

To illustrate the function of skew compensator 300, signals propagating through system 100 (which includes skew compensator 300) are shown in FIGS. 5A and 5B. In this example, transmitter 102 outputs a differential signal, where the portions INM and INP can have a value of +1 or −1 (assuming differential amplifier 306 has unity gain). As the differential signal propagates across medium 104, 1 UI of intra-pair skew is introduced, which significantly distorts the differential signal. It can, however, be recognized that the intra-pair skew converts the differential signal to common-mode, since there is a difference between the common-mode voltage VCM and the average VCMA (which for this example is 0). When the difference between portions INM and INP (i.e., INP-INM) is taken by differential amplifier 308, this difference can have values of +2, 0, and −2, and the difference does not match the desired (deskewed) output from transmitter 102. Because the difference between the common-mode voltage VCM and the average VCMA can have values of −1, 0, or +1, differential amplifier 308 (for this example) applies again of 2 so as to generate the deskew information (i.e., 2*(VCM-VCMA)). This deskew information can then be combined with the difference between the portions INM and INP by combiner 310 (which can, for example, be an adder or node) to generate the output signal VOUT, which generally matches the output of the transmitter 102. It should also be noted that the gains of differential amplifiers 306 and 308 are typically different, and that the gain of differential amplifier 308 will typically be at least twice or double the gain of differential amplifier 306.

Turning now to FIGS. 6-8, other examples of the operation of the skew compensator 300 can be seen. In FIG. 6, there is no intra-pair skew, so the skewed and deskewed signals generally match (but are shown with different scales). In FIG. 7, ½ UI (which is about 50 ps for this example) of skew is introduced, and the skew compensator 300 is able to fully recover the eye. In FIG. 8, there is 1 UI (i.e., about 100 ps for this example) of skew (which significantly distorts the differential signal), and the skew compensator 300 is able to recover the differential signal.

Having thus described the present invention by reference to certain of its preferred embodiments, it is noted that the embodiments disclosed are illustrative rather than limiting in nature and that a wide range of variations, modifications, changes, and substitutions are contemplated in the foregoing disclosure and, in some instances, some features of the present invention may be employed without a corresponding use of the other features. Accordingly, it is appropriate that the appended claims be construed broadly and in a manner consistent with the scope of the invention.

The invention claimed is:

1. An apparatus comprising:
   a measuring circuit that is configured to receive a differential signal and that is configured to determine a common-mode voltage;
   an averaging circuit that is configured to receive the differential signal and that is configured to determine an average for the common-mode voltage; and
   an output circuit having that is coupled to the measuring circuit and the averaging circuit and that is configured to receive the differential signal, wherein the output circuit determines a difference between first and second portions of the differential signal, and wherein the output circuit determines deskew information from the common-mode voltage and the average, and wherein the output circuit generates a deskewed differential signal from the deskew information and the difference.

2. The apparatus of claim 1, wherein the output circuit further comprises:
   a first differential amplifier that is configured to receive the differential signal;
   a second differential amplifier that is coupled to the measuring circuit and the averaging circuit; and
   an adder that is coupled to the first and second differential amplifiers.

3. The apparatus of claim 2, wherein the first and second amplifiers have first and second gains, respectively, wherein the second gain is twice the first gain.

4. The apparatus of claim 1, wherein the measuring circuit further comprises a voltage divider.

5. The apparatus of claim 1, wherein the averaging circuit further comprises:
   a first resistor that is configured to receive the first portion of the differential signal and that is coupled to the output circuit;
   a second resistor that is coupled to the first resistor and that is configured to receive the second portion of the differential signal; and
   a capacitor that is coupled to the first and second resistors.

6. A method comprising:
   measuring a common-mode voltage of a differential signal;
   measuring an average for the common-mode voltage of the differential signal;
   determining a difference between first and second portions of the differential signal;
   determining deskew information from the common-mode voltage and the average; and
   combining the deskew information with the difference to deskew the differential signal.

7. The method of claim 6, wherein the step of determining the deskew information further comprises determining a difference between the common-node voltage and the average.

8. The method of claim 7, wherein the step of determining the difference between the first and second portions of the differential signal further comprises applying a gain to the difference between the first and second portions of the differential signal.

9. The method of claim 8, wherein the gain further comprises a first gain, and wherein the step of determining the deskew information further comprises applying a second gain to the difference between the common-node voltage and the average.

10. The method of claim 9, wherein the second gain is at least twice the first gain.

11. An apparatus comprising:
    a first terminal that is configured to receive a first portion of a differential signal;
    a second terminal is configured to receive a second portion of the differential signal;
    a measuring circuit that is coupled to the first and second terminals and that is configured to determine a common-mode voltage;
    an averaging circuit that is coupled to the first and second terminals and that is configured to determine an average for the common-mode voltage;
    a first difference circuit that is coupled to the first and second terminals and that is configured to determine a difference between the first and second portions of the differential signal;
    a second difference circuit that is coupled to the measuring circuit and the averaging circuit and that is configured to determine deskew information from the common-mode voltage and the average; and
    a combiner that is coupled to the first and second output circuits.

12. The apparatus of claim 11, wherein the first difference circuit further comprises a differential amplifier having a gain.

13. The apparatus of claim 12, wherein the differential amplifier further comprises a first differential amplifier, and wherein the gain further comprises a first gain, and wherein the second difference circuit further comprises a second differential amplifier having a second gain.

14. The apparatus of claim 13, wherein the combiner further comprises a node.

15. The apparatus of claim 13, wherein the second gain is at least twice the first gain.

16. The apparatus of claim 15, wherein the measuring circuit further comprises:
    a first resistor that is coupled to the first terminal and the second differential amplifier; and
    a second resistor that is coupled between the second terminal and the first resistor.

17. The apparatus of claim 16, wherein the averaging circuit further comprises:
    a node that is coupled to second differential amplifier;
    a third resistor that is coupled between the first terminal and the node;
    a fourth resistor that is coupled between the second terminal and the node; and
    a capacitor that is coupled to the node.

* * * * *